(12) United States Patent
Dabral

(10) Patent No.: US 10,311,938 B2
(45) Date of Patent: *Jun. 4, 2019

(54) COMPACT SYSTEM WITH MEMORY AND PMU INTEGRATION

(71) Applicant: Apple Inc., Cupertino, CA (US)

(72) Inventor: Sanjay Dabral, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/430,747

(22) Filed: Feb. 13, 2017

(65) Prior Publication Data

US 2017/0154664 A1 Jun. 1, 2017

Related U.S. Application Data

(63) Continuation of application No. 14/196,793, filed on Mar. 4, 2014, now Pat. No. 9,607,680.

(51) Int. Cl.
*G11C 11/4074* (2006.01)
*G11C 14/00* (2006.01)
(Continued)

(52) U.S. Cl.
CPC .......... *G11C 11/4074* (2013.01); *G11C 5/147* (2013.01); *G11C 7/02* (2013.01); *G11C 14/0018* (2013.01); *G11C 29/021* (2013.01); *H01L 23/49822* (2013.01); *H01L 23/5223* (2013.01); *H01L 23/642* (2013.01); *H01L 23/645* (2013.01); *H01L 25/0657* (2013.01); *H01L 23/5227* (2013.01); *H01L 24/13* (2013.01); *H01L 24/16* (2013.01); *H01L 24/48* (2013.01); *H01L 25/18* (2013.01); *H01L 2224/13025* (2013.01); *H01L 2224/16145* (2013.01);
(Continued)

(58) Field of Classification Search
CPC . G11C 11/4074; G11C 14/0018; G11C 5/147; H01L 25/065; H01L 23/64
See application file for complete search history.

(56) References Cited

U.S. PATENT DOCUMENTS 6,034,391 A * 3/2000 Tobita ................... H01L 27/108
257/306
6,349,067 B1 * 2/2002 Hsu ......................... G11C 7/02
257/E21.544
(Continued)

OTHER PUBLICATIONS

Balaji et al. ("Performance Analysis and Modeling of Deep Trench Decoupling Capacitor for 32 nm High-Performance SOI Processors and Beyond", IC Design & Technology (ICICDT), 2012 IEEE International Conference, Jul. 2012).*
(Continued)

*Primary Examiner* — Mushfique Siddique
(74) *Attorney, Agent, or Firm* — Meyertons, Hood, Kivlin, Kowert & Goetzel, P.C.; Lawrence J. Merkel

(57) ABSTRACT

One or more integrated circuits including at least one integrated circuit that is fabricated in a DRAM fabrication process. Capacitors in the DRAM-fabricated integrated circuit can be used for decoupling for logic components of the integrated circuits, and may be used for fine-grain on-chip PMUs. Embedded DRAM memories can be used instead of SRAM memories, with increased density and reduced leakage. More compact systems can be implemented using the integrated circuits.

19 Claims, 5 Drawing Sheets

(51) Int. Cl.

| | |
|---|---|
| *H01L 23/64* | (2006.01) |
| *H01L 25/065* | (2006.01) |
| *H01L 23/498* | (2006.01) |
| *H01L 23/522* | (2006.01) |
| *G11C 7/02* | (2006.01) |
| *G11C 5/14* | (2006.01) |
| *G11C 29/02* | (2006.01) |
| *H01L 23/00* | (2006.01) |
| *H01L 25/18* | (2006.01) |

(52) U.S. Cl.
CPC ........... *H01L 2224/16225* (2013.01); *H01L 2224/48227* (2013.01); *H01L 2225/0651* (2013.01); *H01L 2225/06513* (2013.01); *H01L 2225/06517* (2013.01); *H01L 2225/06541* (2013.01); *H01L 2924/00014* (2013.01); *H01L 2924/14* (2013.01); *H01L 2924/1427* (2013.01); *H01L 2924/1431* (2013.01); *H01L 2924/1432* (2013.01); *H01L 2924/1434* (2013.01); *H01L 2924/1436* (2013.01); *H01L 2924/19041* (2013.01); *H01L 2924/19042* (2013.01); *H01L 2924/19103* (2013.01); *H01L 2924/19104* (2013.01)

(56) References Cited

U.S. PATENT DOCUMENTS

| | | | |
|---|---|---|---|
| 6,424,209 B1 | 7/2002 | Gorecki | |
| 9,607,680 B2 | 3/2017 | Dabral | |
| 2002/0074668 A1* | 6/2002 | Hofstee | H01L 23/3677 257/777 |
| 2003/0148578 A1* | 8/2003 | Ku | H01L 23/5223 438/239 |
| 2009/0195295 A1 | 8/2009 | Uematsu | |
| 2009/0327776 A1* | 12/2009 | Nguyen | G06F 1/26 713/320 |
| 2010/0213573 A1* | 8/2010 | Han | H01L 23/5223 257/532 |
| 2010/0219502 A1 | 9/2010 | Shieh et al. | |
| 2012/0166823 A1 | 6/2012 | Kam et al. | |
| 2012/0250443 A1* | 10/2012 | Saraswat | G11C 5/14 365/226 |
| 2013/0141858 A1* | 6/2013 | Pyeon | G06F 1/18 361/679.31 |
| 2014/0068293 A1* | 3/2014 | Man | G06F 1/32 713/320 |
| 2014/0173207 A1 | 6/2014 | Wang et al. | |
| 2014/0181545 A1* | 6/2014 | Shrall | G06F 1/3206 713/320 |
| 2014/0215277 A1* | 7/2014 | Judd | G06F 11/2284 714/42 |
| 2014/0264732 A1* | 9/2014 | Elsherbini | H01L 27/06 257/531 |
| 2015/0255142 A1 | 9/2015 | Dabral | |
| 2016/0371216 A1* | 12/2016 | Shekhar | G06F 13/4068 |

OTHER PUBLICATIONS

"System-on-Chip Beyond the Nanometer Wall", Philippe Magarshack and Pierre G. Paulin, Jun. 2-6, 2003, pp. 419-424.

Power Electronic Systems Laboratory, "A 4.6 W/mm2 Power Density 86% Efficiency On-Chip Switched Capacitor DC-DC Converter in 32nm SOI CMOS", T. Anderson et al., Feb. 17-21, 2013, pp. 1-9.

"A 0.039um2 High Performance eDRAM Cell based on 32nm High-K/Metal SOI Technolocy", N. Butt, et al., 2010, pp. 27.5.1-27.5.4.

"A 22nm High Performance Embedded DRAM SoC Technology Featuring Tri-gate Transistors and MIMCAP COB", R. Brain, et al., 2013, pp. T16-T17.

"Fully-Integrated Power Management with Switched-Capacitor DC-DC Converters", Hanh-Phuc Le, 2010. pp. 1-30.

"A High Density Cylinder-Type MIM Capacitor Integrated with Advanced 28nm Logic High-K/Metal-Gate Process for Embedded DRAM", K.C. Tu, et al., 2012. pp. 1-2.

Balaji et al. ("Performance Analysis and Modeling of Deep Trench Decoupling Capacitor for 32 nm High Performance SOI Processors and Beyond," 2012, 2012 IEEE International COnference in IC Design and Technology).

\* cited by examiner

COMPACT SYSTEM WITH MEMORY AND PMU INTEGRATION

This application is a continuation of U.S. patent application Ser. No. 14/196,793, filed Mar. 4, 2014 and now U.S. Pat. No. 9,607,680, which is hereby incorporated by reference in its entirety.

BACKGROUND

Field of the Invention

Embodiments described herein are related to the field of integrated circuits and, more particularly, to integrating dynamic random access memory, fine-grain power management, and other logic onto an integrated circuit and/or into a module.

Description of the Related Art

Mobile electronic devices have become ubiquitous, and many people own several such devices. Mobile electronic devices can include, e.g., mobile phones (especially smart phones), personal digital assistants, tablet computers, laptop computers, net top computers, eReaders, etc. Mobile electronic devices (or more briefly, mobile devices) are designed to operate on a portable power supply, e.g. a battery. Accordingly, limiting power consumption and consuming power efficiently are key design parameters for the components of the mobile devices. Additionally, the relatively small form factors of many mobile devices call for reduced component counts, sizes, footprints, etc.

Counterbalancing low power and small size demands are the high performance requirements that come from the extraordinary functionality of the mobile devices. A user is able to browse the web, receive and send email, text, talk, and use other applications concurrently on modern mobile devices. The ability to provide an acceptable user experience across these different workloads is an important feature of the device.

SUMMARY

In an embodiment, an integrated circuit for use in mobile devices may be implemented using a dynamic random access memory (DRAM) fabrication process or a process having significant capacitive element capability. This capacitor may be optimized for power applications, and balanced for memory or logic operations. The technology may be an embedded DRAM (eDRAM) fabrication process in which DRAM is embedded on the same integrated circuit die as logic circuitry such as a processor or other logic components of a system. In other embodiments, the process may be a normal DRAM fabrication process and the logic circuits may operate somewhat more slowly than in an eDRAM process. The capacitors supported by the fabrication process may be high quality capacitors, e.g. as compared to those that may be formed in an advanced logic process as is typically used for integrated circuits that include processors and/or other logic components. The capacitors may be dense, and may have low non-capacitive parasitics (e.g. resistance and/or inductance) due to the DRAM process in which they are formulated.

In various embodiments, the capacitors may be used as decoupling capacitors (decap) and/or in voltage regulators for on-chip power management units. The high quality decap may improve response to noise and current-based supply voltage drop (e.g. IR drop). The on-chip voltage regulators may allow fine-grain PMUs on chip, which may reduce power consumption and may provide more granularity in powering up/down components on the integrated circuit. Additionally, integrating the voltage regulators may reduce component count at the system level, which may permit a more compact system.

In some embodiments, the integrated circuit may include an on-chip memory (e.g. a cache) formed of DRAM memory. The on-chip memory may be denser that a corresponding SRAM memory, reducing cost or permitting a larger capacity memory in the same integrated circuit die area. Additionally, leakage current in the memory may be significantly reduced in the DRAM as compared to the SRAM memory, reducing power consumption.

BRIEF DESCRIPTION OF THE DRAWINGS

The following detailed description makes reference to the accompanying drawings, which are now briefly described.

Figure 1:
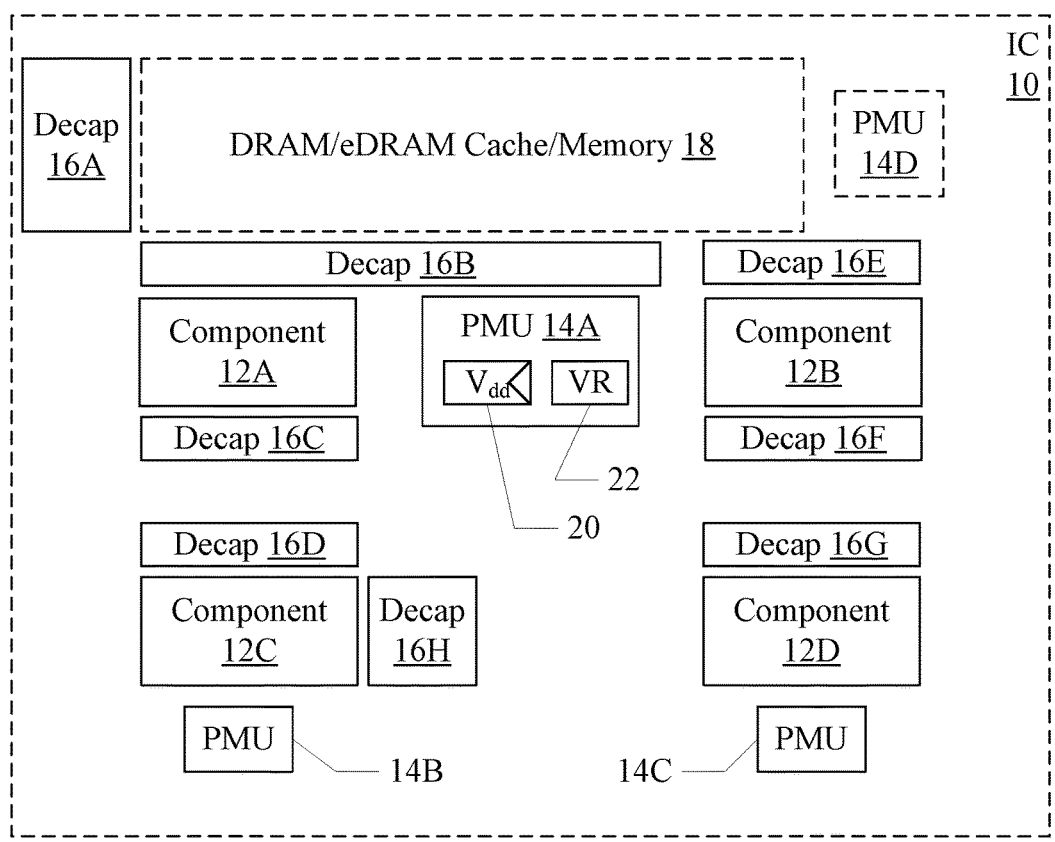
FIG. 1 is a block diagram of one embodiment of an integrated circuit.

While the embodiments described herein are susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

FIG. 1 is a block diagram of one embodiment of an integrated circuit (IC) 10. In the illustrated embodiment, the integrated circuit 10 includes a set of components 12A-12D, power management units (PMUs) 14A-14D, decoupling capacitors (decaps) 16A-16H, and a memory 18. The PMU 14A is shown to include a register 20 and a voltage regulator 22. Other PMUs 14B-14C may be similar.

The integrated circuit 10 may be manufactured using a dynamic random access memory (DRAM) fabrication process. A DRAM fabrication process may generally be optimized for producing DRAM memories. A DRAM memory cell includes a capacitor and a transistor that acts as a switch to permit access to the cell. The voltage on the capacitor represents the value stored in the cell. Accordingly, the DRAM fabrication process may be optimized to produce high quality capacitors and to permit dense packing of the DRAM cells. A high quality capacitor may be small for a given capacitance. A high quality capacitor may have low non-capacitive parasitics (e.g. resistance or inductance). That is, a high quality capacitor may approach, as nearly as practicable, an ideal capacitor. In an embodiment, the DRAM fabrication process may be a standard DRAM process used to produce DRAM chips. Such chips may have a large array of DRAM cells and a relatively small amount of logic circuitry (to receive addresses, access the array, and provide/receive data to/from the array) and may be optimized for memory, whereas the speed, size, and other aspects of the logic circuitry may not be as optimized. The DRAM fabrication process may also be an embedded DRAM (eDRAM) process, which may more equally optimize the logic circuits and the DRAM memory circuits. The eDRAM process is largely built off a logic process. This process may be used to embed DRAM memories in integrated circuits that include significant logic circuits needing cache/memory in close proximity (e.g. processors such as central processing units (CPUs), graphics processing units (GPUs), peripherals and/or peripheral interface controllers, etc.). A more equal optimization of memory and logic circuitry may permit good DRAM density with well-performing logic circuitry on the same die. There are several methods for forming the capacitors that are included, such as in the semiconductor substrate (e.g. a trench capacitor), or as capacitors above the semiconductor substrate in the interconnect.

Each PMU 14A-14D may provide a power supply voltage (or more briefly, "supply voltage") to the components to which it is coupled. For example, in the embodiment of FIG. 1, the PMU 14A may be coupled to the components 12A-12B. The PMU 14B may be coupled to the component 12C, the PMU 14C may be coupled to the component 12D, and the PMU 14D may be coupled to the memory 18. The magnitude of the supply voltage may be programmed into the register 20, and may be changed from time to time as desired during operation by reprogramming the register 20. The PMU 14A may be coupled to receive an input supply voltage that is provided to the IC 10, and may be configured generate the desired supply voltage as an output using the voltage regulator 22.

Because the PMUs 14A-14D are on-chip, they may be physically located near the components to which they provide power. Thus, IR drops due to distance from source to consumer may be minimized. In some embodiments, the PMUs 14A-14D may replace power switches. Additionally, the PMUs may be as fine grain as desired. Multiple different supply voltage magnitudes may be supported concurrently in the IC 10 based on the same input supply voltage to the IC 10.

As illustrated in FIG. 1, a PMU may be dedicated to a component (e.g. the PMU 14B may be dedicated to the component 12C, and the PMU 14C may be dedicated to the component 12D). Alternatively, a PMU may be shared between two or more components (e.g. the PMU 14A may be shared between the components 12A-12B). A PMU may be shared, e.g., if the components would typically be powered up and powered down together. That is, one component may be required for the other component to operate.

The voltage regulator 22 may include one or more capacitors. The capacitors may be formed using the DRAM fabrication process, and thus may be high quality capacitors as discussed below with respect to the decaps 16A-16H. Various exemplary voltage regulator circuits are described below with respect to FIGS. 2 and 3.

The decaps 16A-16H may be coupled to the power supply grid at various locations in the integrated circuit 10 (not shown) to improve stability of the power supply voltage at times when local current changes and/or noise would cause the power supply voltage magnitude to vary excessively (e.g. AC droop), which may cause erroneous circuit operation. In cases in which power gating is implemented, the decaps 16A-16G may be coupled to the local (switched) power grid, the global (unswitched) power supply grid, or both. Generally, the decaps 16A-16G may be placed as near as practical to the source of the current/site of the expected AC voltage droop. Thus, the decaps 16A, 16B, and 16E may all stabilize the memory 18; the decaps 16B and 16C may stabilize the component 12A, the decaps 16D and 16H may stabilize the component 12C, the decaps 16E-16F may stabilize the component 12B, and decaps 16G may stabilize the component 12D.

The memory 18 may be an optional part of the IC 10. That is, there are embodiments of the IC 10 that do not include the memory 18. The memory 18 may be formed from the DRAM or eDRAM that is supported by the DRAM fabrication process used to manufacture the IC 10. The memory 18 may be a cache memory (and thus there may be an off-chip system memory in a system that includes the IC 10). Alternatively, the memory 18 may be the system memory (and the next level in the hierarchy off chip may be non-volatile storage such as disk for flash memory). There may be more than one memory 18 in various embodiments, and there may be both cache memory and system memory within the IC 10. In either case, the use of DRAM technology for the memory may lead to higher density and lower power consumption than a similar-sized SRAM memory. In various embodiments, the memory 18 may be capacitor under bit cell or capacitor over bit cell construction. The capacitors in the decaps 16A-16H and the voltage regulators 22 may be the same construction as the capacitors in the memory 18. That is, the capacitors in the decaps 16A-16H and voltage regulators 22 may be formed in the same fashion as the capacitors in the memory 18.

The components 12A-12D may include any logic circuitry that is desired in the IC 10. The components may include processors such as CPUs, GPUs, digital signal processors (DSPs), chip set, System on Chip (SOC), input/output (I/O) processors, etc. The components may include memory controllers for interface to off-chip memory. The components may include various peripherals such as video peripherals, audio peripherals, networking peripherals, peripheral interface controllers, etc. Any set and number of components 12A-12D may be included in various embodiments, including more or fewer components than those shown in FIG. 1. Generally, various embodiments of the IC 10 may include any number and configuration of the various features shown in FIG. 1, including more or fewer than those shown and differing arrangements of those shown and/or other features.

Figure 2:
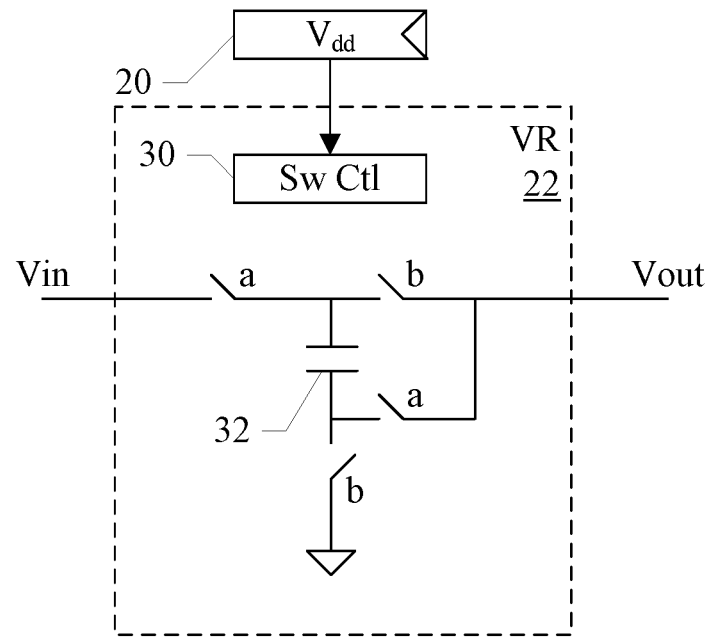
FIG. 2 is a circuit diagram of one embodiment of a switched capacitor voltage regulator.

Turning now to FIG. 2, a circuit diagram of one embodiment of the voltage regulator 22 and the register 20 is shown. The embodiment of FIG. 2 may be a switched-capacitor regulator. In the illustrated embodiment, the voltage regulator 22 may include a switch control circuit 30, a capacitor 32, and switches (labeled "a" and "b" in FIG. 2) all coupled as shown in FIG. 2. The input voltage (Vin) may be a power supply voltage supplied to the IC 10, e.g. on one or more pins of the IC 10. Alternatively, the input voltage may be sourced from another voltage regulator in another PMU. The output voltage (Vout) may be the power supply voltage supplied to the component(s) controlled by the PMU. For example, Vout may be the power supply voltage supplied by the PMU 14A to the components 12A-12B in FIG. 1, or the power supply voltage supplied by the PMU 14B to the component 12C in FIG. 1.

Based on the magnitude of the input voltage Vin and the desired magnitude of the output voltage Vout from register 20, the switch control circuit 30 may be configured to control the switches a and b to produce, on average, a Vout voltage of the desired magnitude. When the switches a are closed and the switches b are open, the capacitor 32 may be charged. When the switches a are open and the switches b are closed, the capacitor 32 may provide the charge for the Vout supply voltage. Thus, the capacitor may be discharging when the switches b are closed. The switches a and b may be formed in any desired fashion. For example, the switches may be transistors, passgate circuits, etc.

The capacitor 32 may be formed using the DRAM fabrication process, and thus may be a high quality capacitor similar to the ones formed in DRAM memories that would be formed using the DRAM fabrication process. In an embodiment, capacitors similar to those shown in FIG. 6 may be used. More than one capacitor may be used, in series and/or parallel, to provide the desired capacitance and stability of the supply voltage Vout. The switches implemented with the various capacitors may be controlled by the switch control circuit 30 with different timings, phases, etc. to provide a more stable, low ripple supply voltage.

Figure 3:
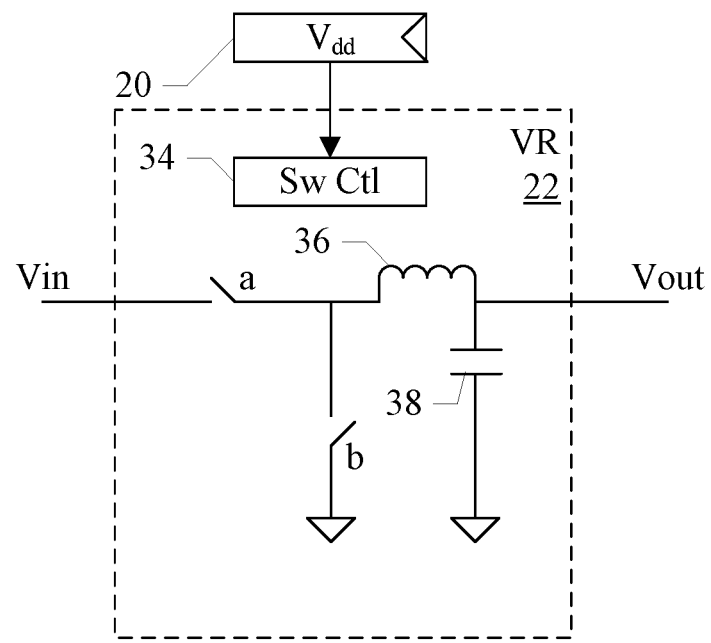
FIG. 3 is a circuit diagram of one embodiment of a buck voltage regulator.

FIG. 3 is a circuit diagram of another embodiment of the voltage regulator 22 and the register 20. The embodiment of FIG. 3 may be a buck regulator. In the illustrated embodiment, the voltage regulator 22 may include a switch control circuit 34, an inductor 36, and a capacitor 38, and switches (labeled "a" and "b" in FIG. 3) all coupled as shown in FIG. 3. The input voltage (Vin) may be a power supply voltage supplied to the IC 10, e.g. on one or more pins of the IC 10. Alternatively, the input voltage may be sourced from another voltage regulator in another PMU. The output voltage (Vout) may be the power supply voltage supplied to the component(s) controlled by the PMU. For example, Vout may be the power supply voltage supplied by the PMU 14A to the components 12A-12B in FIG. 1, or the power supply voltage supplied by the PMU 14B to toe component 12C in FIG. 1.

Based on the magnitude of the input voltage Vin and the desired magnitude of the output voltage Vout from register 20, the switch control circuit 34 may be configured to control the switches a and b to produce, on average, a Vout voltage of the desired magnitude. When the switch a is closed and the switch b is open, current flows through the inductor 36 and a voltage drop across the inductor 36 forms in response to the changing current, thus reducing the voltage on the capacitor 38 (and Vout). When the switch a is open and the switch b is closed, the energy stored in the magnetic field of the inductor 36 may continue current flow and may help to maintain the voltage Vout. The switches a and b may be formed in any desired fashion. For example, the switches may be transistors, passgate circuits, etc.

Figure 9:
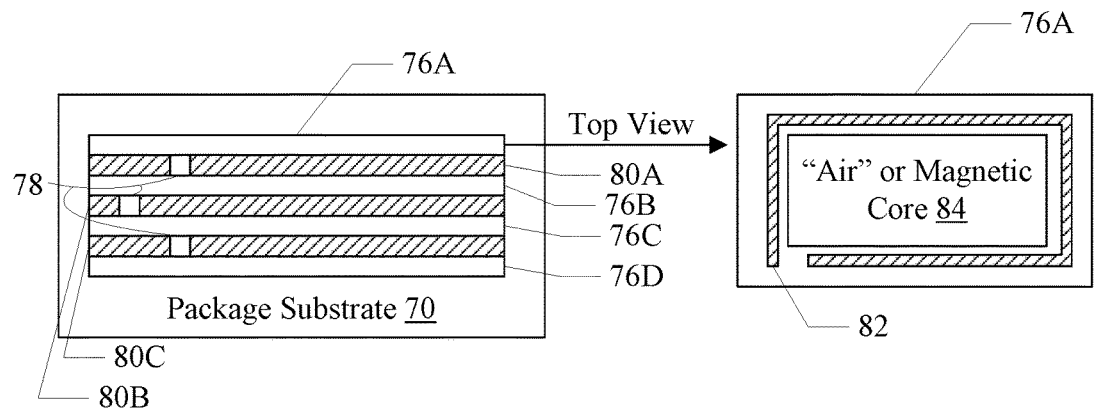
FIG. 9 is a block diagram of another embodiment of the inductor in the package substrate.

The capacitor 38 may be formed using the DRAM fabrication process, and thus may be a high quality capacitor similar to the ones formed in DRAM memories that would be formed using the DRAM fabrication process. In an embodiment, capacitors similar to those shown in FIG. 6 may be used. More than one capacitor may be used, in series and/or parallel, to provide the desired capacitance and stability of the supply voltage Vout. The inductor 36 may be formed on the IC 10 is some cases, or may be formed on or in the package substrate of the package for the IC 10. Examples are illustrated in FIGS. 7 to 9.

Figure 4:
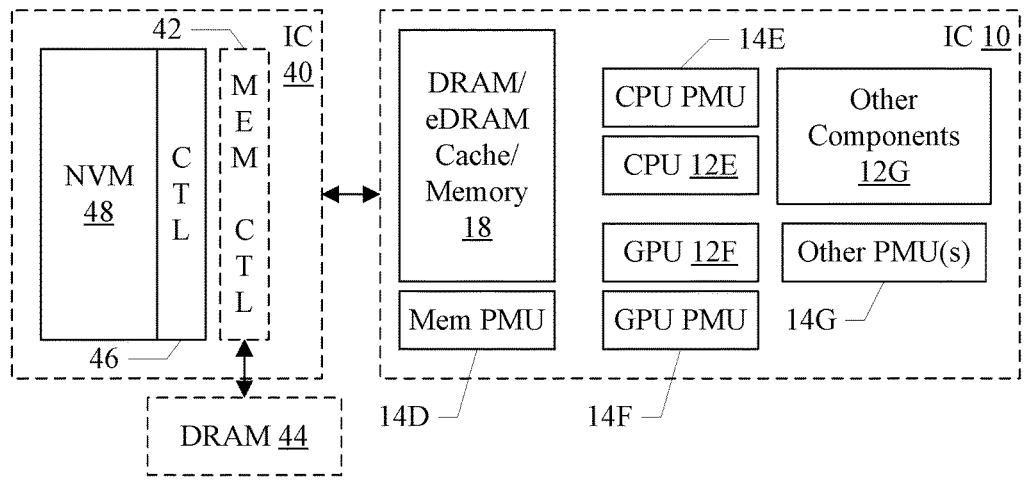
FIG. 4 is a block diagram of one embodiment a system including multiple integrated circuits.

FIG. 4 is a block diagram of a system including an embodiment of the IC 10 and a second IC 40. In the illustrated embodiment, the IC 10 may be fabricated using the DRAM fabrication process, and the IC 40 may be fabricated using a different process. The IC 10 may include the memory 18, and a corresponding PMU 14D. The components of the IC 10 may include one or more CPUs 12E with a corresponding PMU 14E; one or more GPUs 12F with a corresponding PMU 14F; and/or one or more other components 12G with a corresponding PMU 14G. Decaps may be included as well, as shown in FIG. 1. The IC 40 may optionally include a memory controller 42 to couple to a DRAM memory 44, and may include a controller 46 and a non-volatile memory (NVM) 48. Any sort of non-volatile memory may be used (e.g. NAND flash, NOR flash, other non-volatile memories, etc.).

In the system of FIG. 4, if the memory 18 is large enough for the targeted work loads, the memory 18 may be used as a system memory and the memory controller 42 and DRAM 44 may not be included. The flash memory 48 may serve as a non-volatile backing storage for the memory 18. If the memory 18 is not large enough, the memory 18 may be a cache memory and the memory controller 42 and DRAM 44 may be included, with the flash memory 48 serving as a backing store for the DRAM 44. The system may be fairly compact, and may be power efficient due to the reduced number of components (e.g. external PMUs may be reduced or eliminated) and due to the fine-grained on-chip PMUs 14.

Figure 5:
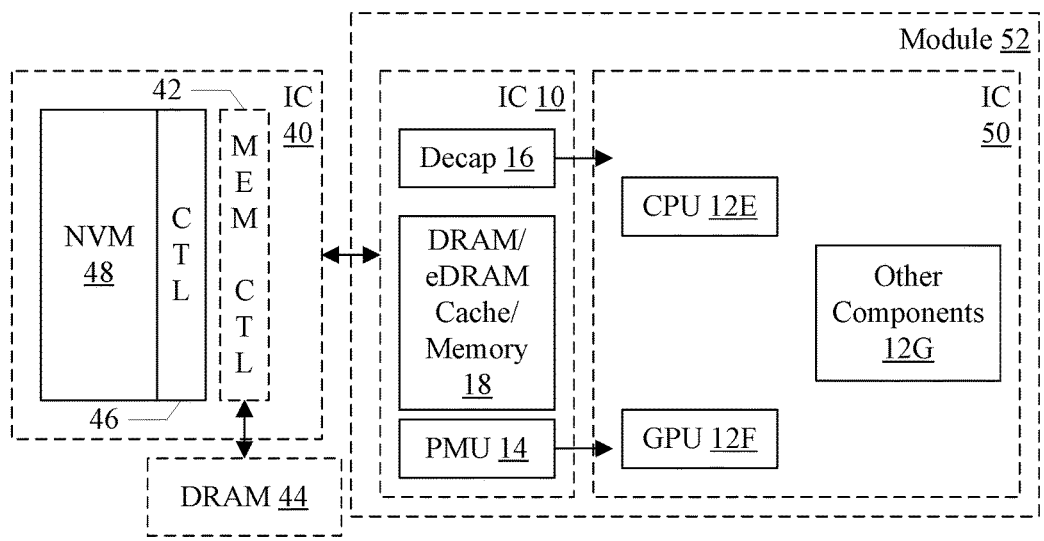
FIG. 5 is a block diagram of another embodiment of a system including multiple integrated circuits.

FIG. 5 is a block diagram illustrating another embodiment of a system including an embodiment of the IC 10, the IC 40, and another IC 50. The IC 10 may be fabricated using the DRAM fabrication process, and the IC 50 may be fabricated using a different process (e.g. an advanced logic process optimized for digital logic circuitry rather than DRAM). The IC 40 may be similar to the IC 40 shown in FIG. 4. The IC 10 may include, in the illustrated embodiment, one or more PMUs 14, optionally the memory 18, and decaps 16.

The PMUs 14 may provide power supply voltage(s) to the components in the IC 50 (e.g. the CPU 12E, the GPU 12F, and/or the other components 12G, and the decaps 16 may be coupled to power supply grids in and around the components. The decaps 16 and PMUs 14 may also serve the memory 18, in some embodiments. The embodiment of FIG. 5 may still support a compact system while permitting both the advanced logic process and the DRAM fabrication process to be used for their respective circuitry. In the illustrated embodiment, the IC 10 and the IC 50 may be packaged in a module 52. For example, the module 52 may be a multi-chip module (MCM) may be used in an embodiment. In other embodiments, package-on-package packaging, chip-on-chip packaging, silicon-on-silicon packaging, system in package etc. may be used. For example the IC 10 may be implemented with through-silicon vias (TSV) to connect the IC 50 to a circuit board or package substrate, and the IC 50 may be mounted on top of the IC 10 in a chip-on-chip configuration. In another embodiment, TSVs may not be used. The IC 50 may be mounted on top of the IC 10 and wire bonds may be used to reach the package, or the IC 10 may be mounted below the IC 50 in a flip-chip configuration and solder balls may be used to reach the package. Any packaging configuration may be used.

Figure 6:
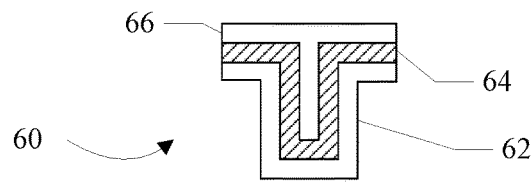
FIG. 6 is a block diagram of one embodiment of a capacitor.
Figures 7, 8:
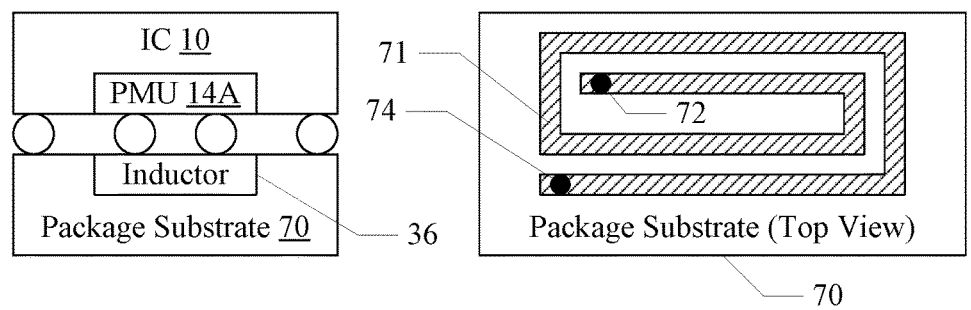
FIG. 7 is a block diagram of one embodiment of an integrated circuit and associated package substrate.
FIG. 8 is a block diagram of one embodiment of an inductor on the package substrate.

FIG. 6 is a block diagram illustrating one embodiment of a DRAM-based capacitor 60 that may be used for the decaps 16 and/or PMUs 14. That is, the capacitor 60 may be fabricated in the same fashion that capacitors for the DRAM memory 18 are fabricated, using the DRAM fabrication process. The view in FIG. 6 may be a side view, where the semiconductor substrate would be below the capacitor 60 as illustrated in FIG. 6. The illustrated capacitor 60 may be formed in wiring layers above the semiconductor substrate. The bottom plate 62 and the top plate 66 of the capacitor may be formed from conductive metals used in the process (e.g. aluminum, copper, tungsten, alloys of the above, etc.). A high K dielectric 64 used in the wiring layers may be included between the top plate 66 and the bottom plate 62, providing a compact, high quality capacitor.

Other embodiments may implement the capacitors in different fashion, including DRAM fabrication processes that implement the capacitor in the semiconductor substrate (e.g. "below" the bit cells). Exemplary capacitors of this type may include deep trench capacitors of various types.

FIGS. 7-9 illustrate various embodiments for implementing an inductor, e.g. for buck voltage regulators such as the regulator shown in FIG. 3. In the illustrated embodiments, the inductor is implemented separate from the IC 10 (e.g. as a discrete component), although some embodiments may implement the inductor in the IC 10 as well. FIG. 7 illustrates an embodiment in which the inductor 36 is embedded in a package substrate 70 of a package that encapsulates the IC 10. The PMU 14A my thus have connections (e.g. through solder balls in the illustrated embodiment, although any conductor may be used) to the inductor 36 in the package substrate 70. The inductor 36 may be discrete inductor embedded in the substrate 70, or may be formed as part of the substrate 70 (e.g. using the wiring layers). FIG. 8 is a top view of the package substrate 70 in which a spiral wound planar wire 71 forms the inductor (with connection points 72 and 74 to connect to the PMU 14A). FIG. 9 is side view of an embodiment of the package substrate 70 in which a coiled wire approach is used. In the embodiment of FIG. 9, multiple wiring layers 76A-76D are coupled through vias 78 in the insulating layers 80A-80C to form the coiled wire. A top view of the layer 76A illustrates the wire 82 in the layer, wound around an "air" or magnetic core 84. An "air" core embodiment may be an insulating material, for example. A magnetic core may be used to enhance the inductive effect, in other embodiments.

The decaps 16A-16H may be large structures, in some cases, and thus may be more susceptible to manufacturing defects that may reduce the yield of the IC 10. For example, the decaps 16A-16H may be more likely to suffer from a short in one of the capacitors, which renders the decap in which the short occurs useless, since the short will prevent the build-up of charge on the other capacitors that are in parallel. Additionally, the short between power and ground may prevent operation of the IC 10 overall, thus reducing the yield. Defects may be reduced using other dielectric materials, modifying dielectric height, or optimizing capacitor constructions, in some embodiments. Additionally or alternatively, cascaded capacitors and/or adding switches to the capacitors may be used to reduce the effect that defects have on the structure. In an embodiment, single capacitors may be used for decaps where high transient current density exists, and thus high capacitor density may be more important. In other areas where lower transient current density occurs, the cascaded (or stacked) capacitors illustrated in FIGS. 10 and 11 may be used.

Figure 10:
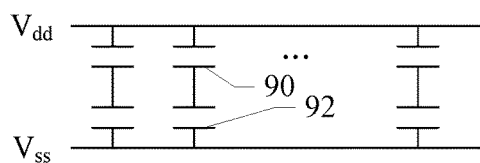
FIG. 10 is a circuit diagram of one embodiment of decap capacitors.

FIG. 10 is a circuit diagram illustrating one embodiment of cascaded capacitors that may be used for one or more of decaps 16A-16H. In the illustrated embodiment, each parallel "leg" of capacitance includes at least two capacitors in series (e.g. the capacitors 90 and 92 are in series). Any number of capacitors may be placed in series in various embodiments.

In the embodiment of FIG. 10, either of the capacitors in a leg may be defective (resulting in a short) and the decap as a whole may remain functional with slightly different overall capacitance. For example, if the capacitor 90 is defective and a short, the capacitor 92 still prevents a short from power to ground. Similarly, if the capacitor 92 is defective and a short, the capacitor 90 still prevents a short from power to ground. If both capacitors in the same leg are shorted, then a short from power to ground may occur. If more capacitors are included in each leg, the probability of having defects that make a complete short may be reduced even further.

Figure 11:
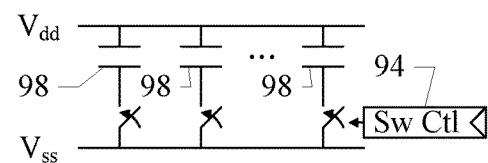
FIG. 11 is a circuit diagram of another embodiment of decap capacitors.

FIG. 11 is a circuit diagram illustrating an embodiment in which capacitors are in series with switches to reduce defects effect on yield and decap effectiveness. A switch control register 94 may be programmable to operate the switches. Accordingly, each capacitor 98 that is defective may be switched out (inline switch open), and capacitors 98 that are not defective may be switched in (inline switch closed). The contents to be programmed in to the register 94 may be determined in a variety of ways. For example, during testing, the register 94 may be programmed to close one switch at time (or multiple switches at time) to test for defects in the capacitors. Any isolated defects may be encoded into the IC 10 (e.g. in fuses, a read-only memory, or a non-volatile memory in the IC 10). Alternatively, an on-chip tester may be included to test the capacitors and program the register 94 with the results. The switches may even participate in the testing (e.g. providing a high resistance path that gradually increases and the voltage may be monitored).

Figure 12:
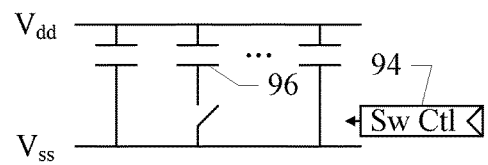
FIG. 12 is a circuit diagram of one instances of the embodiment of FIG. 11 programmed to an exemplary configuration.

FIG. 12 illustrates an example in which the capacitor 96 is defective but other capacitors are not defective. Accordingly, the register 94 may be programmed to open the switch that is inline with the capacitor 96 and to close the other switches.

Numerous variations and modifications will become apparent to those skilled in the art once the above disclosure is fully appreciated. It is intended that the following claims be interpreted to embrace all such variations and modifications.

What is claimed is:

1. A system comprising:
   a first integrated circuit comprising one or more logic circuit components, the first integrated circuit implemented on a first semiconductor die manufactured using a logic circuit fabrication process; and
   a second integrated circuit coupled to the first integrated circuit, wherein the second integrated circuit is manufactured using a dynamic random access memory (DRAM) fabrication process and is implemented on a second semiconductor die that is separate from the first semiconductor die, and the second integrated circuit comprises:
      a plurality of capacitors constructed on the second semiconductor die, wherein the plurality of capacitors are coupled to a plurality of power supply grids on the first integrated circuit to provide decoupling capacitance for the one or more logic circuit components on the first semiconductor die, wherein the plurality of supply grids comprise a local, switched power supply grid for power gating and a global, unswitched power supply grid; and
      a plurality of power management units on the second semiconductor die and configured to provide a power supply to respective ones of the one or more logic circuit components on the first integrated circuit, wherein each power management unit of the plurality of power management units comprises:
         a voltage regulator configured to generate the voltage on the power supply, wherein the voltage regulator comprises one or more second capacitors formed using the DRAM fabrication process; and
         a register that is programmable with a magnitude of the voltage to be generated by the voltage regulator, and wherein the register is changeable during use to change the magnitude.

2. The system as recited in claim 1 wherein the second integrated circuit further comprises a DRAM.

3. The system as recited in claim 2 wherein the DRAM is a cache for a main memory DRAM that is external to the second integrated circuit.

4. The system as recited in claim 3 further comprising a third integrated circuit coupled to the second integrated circuit, wherein the third integrated circuit is coupled to the main memory DRAM.

5. The system as recited in claim 4 wherein the third integrated circuit comprises a memory controller for the main memory DRAM.

6. The system as recited in claim 4 wherein the third integrated circuit further comprises a non-volatile memory.

7. The system as recited in claim 2 wherein the DRAM is a main memory for the system.

8. The system as recited in claim 7 further comprising a third integrated circuit including a non-volatile memory that is a backing store for the DRAM.

9. The system as recited in claim 1 wherein the first integrated circuit and the second integrated circuit are packaged in a multi-chip module.

10. An apparatus comprising:
    a first integrated circuit comprising one or more logic circuit components, the first integrated circuit implemented on a first semiconductor die manufactured using a logic circuit fabrication process; and
    a second integrated circuit coupled to the first integrated circuit, wherein the second integrated circuit is manufactured using a dynamic random access memory (DRAM) fabrication process and is implemented on a second semiconductor die that is separate from the first semiconductor die, and the second integrated circuit comprises:
       a plurality of capacitors constructed on the second semiconductor die, wherein the plurality of capacitors are coupled to a plurality of power supply grids on the first integrated circuit to provide decoupling capacitance for the one or more logic circuit components on the first semiconductor die, wherein the plurality of supply grids comprise a local switched power supply grid for power gating and a global unswitched power supply grid; and
       a plurality of power management units, wherein each power management unit comprises:
          a voltage regulator configured to generate a voltage on a power supply for the first integrated circuit, wherein the voltage regulator comprises one or more second capacitors formed using the DRAM fabrication process; and
          a register that is programmable with a magnitude of the voltage to be generated by the voltage regulator, and wherein the register is changeable during use to change the magnitude.

11. The apparatus as recited in claim 10 wherein the plurality of power management units (PMUs) are coupled to the one or more logic circuit components.

12. The apparatus as recited in claim 10 wherein the second integrated circuit further comprises a DRAM.

13. The apparatus as recited in claim 12 wherein the DRAM is a cache for a main memory DRAM that is external to the second integrated circuit.

14. The apparatus as recited in claim 12 wherein the DRAM is a main memory for a system that includes the apparatus.

15. The apparatus as recited in claim 10 wherein the first integrated circuit and the second integrated circuit are packaged together in an integrated circuit package.

16. A system comprising:
    a plurality of integrated circuits included in an integrated circuit package, wherein:
       at least a first integrated of the plurality of integrated circuits is manufactured using a dynamic random access memory (DRAM) fabrication process;
       at least a second integrated circuit of the plurality of integrated circuits is fabricated using a different fabrication process than the DRAM fabrication process, wherein the first integrated circuit is implemented on a first semiconductor die and the second integrated circuit is implemented on a second semiconductor die that is separate from the first semiconductor die;
       the first integrated circuit comprises a plurality of capacitors constructed on the first semiconductor die that are coupled to a plurality of power supply grids on the second integrated circuit to serve as decoupling capacitance for logic circuits incorporated into the plurality of integrated circuits, including logic circuits incorporated into the second integrated circuit on the second semiconductor die, wherein the plurality of supply grids comprise a local switched power supply grid for power gating and a global unswitched power supply grid; and the first integrated circuit further comprises a plurality of power management units on the first semiconductor die and configured to provide a power supply to the first integrated circuit, wherein each power management unit of the plurality of power management units comprises:

a voltage regulator configured to generate the voltage on the power supply, wherein the voltage regulator comprises one or more second capacitors formed using the DRAM fabrication process; and a register that is programmable with a magnitude of the voltage to be generated by the voltage regulator, and wherein the register is changeable during use to change the magnitude.

17. The system as recited in claim 16 wherein the integrated circuit package is a multi-chip module.

18. The system as recited in claim 16 wherein the integrated circuit package incorporates package-on-package technology.

19. The system as recited in claim 16 wherein the integrated circuit package incorporates chip-on-chip technology.

* * * * *